United States Patent [19]

Sakai et al.

[11] Patent Number: 4,529,995
[45] Date of Patent: Jul. 16, 1985

[54] VARIABLE CAPACITANCE DEVICE

[75] Inventors: Takamasa Sakai; Shoichi Minagawa, both of Tokyo, Japan

[73] Assignee: Clarion Co., Ltd., Tokyo, Japan

[21] Appl. No.: 397,283

[22] Filed: Jul. 12, 1982

[30] Foreign Application Priority Data

Jul. 17, 1981 [JP] Japan .................................. 56-111686
Jul. 17, 1981 [JP] Japan .................................. 56-111688

[51] Int. Cl.³ ............................................ H01L 29/93
[52] U.S. Cl. ........................................ 357/14; 357/20; 357/89
[58] Field of Search ................... 357/14, 51, 89, 20

[56] References Cited

U.S. PATENT DOCUMENTS 2,989,650  6/1961  Doucette et al. ................ 357/14
3,201,664  8/1965  Adam ................................ 357/14
4,449,141  5/1984  Sato et al. ........................ 357/14
4,456,917  6/1984  Sato et al. ........................ 357/15

Primary Examiner—William D. Larkins
Assistant Examiner—Charles S. Small, Jr.
Attorney, Agent, or Firm—Flynn, Thiel, Boutell & Tanis

[57] ABSTRACT

Variable capacitance device consisting of a semiconductor substrate having a first conductivity type semiconductor layer, at least one second conductivity type semiconductor region formed in a surface portion of said first conductivity type semiconductor layer, and a barrier for generating a depletion layer formed on the surface opposite to said surface portion of said first conductivity type semiconductor layer, in which a capacitance reading-out section is disposed on said at least one second conductivity type semiconductor region. A depletion layer control section is disposed on said surface opposite to said surface portion; and said depletion layer control section is reversely biased so that said depletion layer extends from said barrier to a junction portion between said first conductivity type semiconductor layer and said at least one second conductivity type semiconductor region, whereby a capacitance variation results at said capacitance reading-out section in response to variation of the reverse bias voltage.

2 Claims, 9 Drawing Figures

VARIABLE CAPACITANCE DEVICE

FIELD OF THE INVENTION

This invention relates to a capacitance variable device, and more particularly to such a device which is so constructed that its capacitance varies strongly with respect to variations of the reverse bias voltage.

DESCRIPTION OF THE PRIOR ART

Heretofore a P-N junction element, as shown in FIG. 1, has been utilized as a capacitance variable device. In the figure, reference numeral 1 is an N conductivity type semiconductor layer; 2 is a P conductivity type region; 3 is a P-N junction, 4 and 5 are electrodes disposed on said N conductivity type layer 1 and on said P conductivity type region 2, respectively; 6 and 7 are conducting wires disposed on said electrodes 4 and 5, respectively; and 8 is a depletion layer extending from the P-N junction 3 principally in the side of the N conductivity type layer 1 having a low impurity concentration. The depletion layer 8 extends and contracts depending upon the reverse bias voltage applied between the conducting wires 6 and 7 and capacitance variations due to extension and contraction of the depletion layer are read-out between the conducting wires 6 and 7.

However, the prior art variable capacitance devices using a P-N junction element as described above have the following disadvantages.

(1) Since they utilize the dependence of the capacitance of the depletion layer in a P-N junction on the bias voltage, the minimum value of the capacitance is determined by impurity concentration of the semiconductor regions, and on the other hand the maximum value is determined by the increase of a conductance component. It is therefore practically impossible to obtain a wide range of capacitance variations, when Q is great, and also since variations of Q due to capacitance variations are great, this gives rise to difficulties in circuit design.

(2) Since application of the bias voltage for varying capacitance and reading-out of capacitance variations are both carried out by means of the common conducting wires, unnecessary capacitance variations are easily produced by the input signal voltages themselves, when the device is applied to a resonance circuit, etc., and this causes signal deteriorations. Moreover, since a special circuit construction reducing interaction between input signal voltages and the bias voltage is needed, its applications are restricted.

(3) Impurity concentration regulation for the semiconductor region for adjusting capacitance of the depletion layer is performed by means of regulation such as ion implantation methods. Since its production yield is generally low, it is practically impossible to integrate the device into an IC circuit.

SUMMARY OF THE INVENTION

This invention has been made in the face of the problems described above, and an object of this invention is to provide a capacitance variable device, which is so constructed that, using a semiconductor substrate having second conductivity type semiconductor regions formed selectively in a surface portion of a first conductivity type semiconductor layer and a barrier for generating a depletion layer formed on the surface opposite to said surface portion of said first conductivity type semiconductor layer, said second conductivity type regions act as a depletion layer restricting region and capacitance reading-out section, thereby eliminating the disadvantages of the prior art devices.

DETAILED DESCRIPTION OF THE EMBODIMENT

Figure 2:
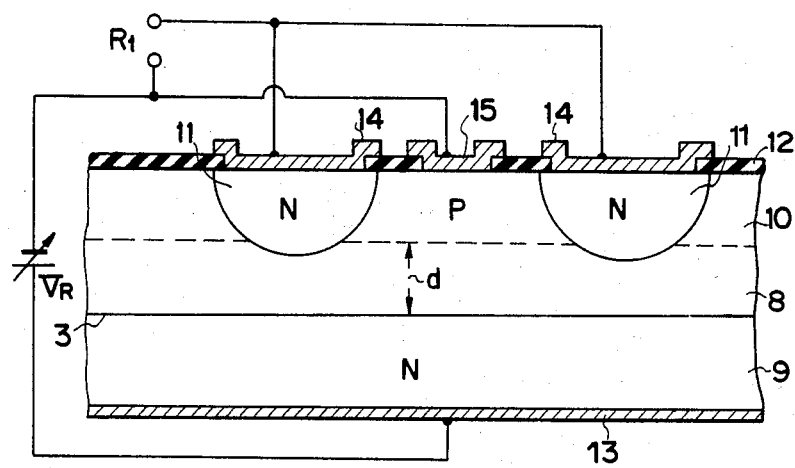
FIG. 2 is a cross-sectional view of a variable capacitance device, according to this invention.

FIG. 2 is a cross-sectional view of a variable capacitance device according to an embodiment of this invention. In the figure, reference numeral 9 represents an N conductivity type layer; 10 is a P conductivity type layer formed on this N conductivity type layer 9; 11 is N conductivity type regions formed selectively in the P conductivity type layer 10; 12 is an insulating layer; 13 is a depletion layer controlling electrode formed on said N conductivity type layer 9; 14 is electrodes for reading out the capacitance formed in said N conductivity type regions 11; 15 is a common counter electrode for both the electrodes 13 and 14; and $R_1$ represents terminals for reading-out the capacitance.

Figure 3A:
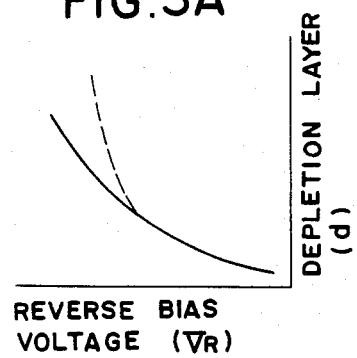
FIG. 3A and 3B are graphs for explaining this invention.
Figure 3B:
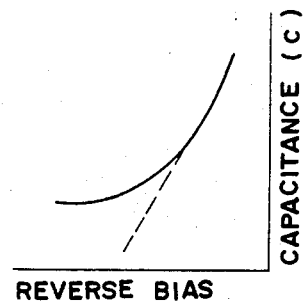

For the construction described above, when a reverse bias voltage $V_R$ is applied between the depletion layer controlling electrode 13 and the common electrode 15, a depletion layer 8 begins to extend from the P-N junction 3 principally on the side of the P conductivity type layer 10, whose impurity concentration is low. The thickness d of this depletion layer varies with the reverse bias voltage $V_R$, and increases with increasing $V_R$, as shown by the full line in FIG. 3(A). In the case where regions having a different conductivity type such as the N conductivity type regions 11 exist in the surface portion of the P conductivity type layer 10, as shown in FIG. 2, when the depletion layer 8, which extends with increasing reverse bias voltage $V_R$, reaches these N conductivity type regions 11, the depletion layer is prevented from extending in these regions 11. That is, in this case, the N conductivity type regions 11 act as depletion layer restricting regions. Consequently, after that, the depletion layer, 8 continues to extend upwards in a portion of the P conductivity type layer 10, which is adjacent to the N conductivity type regions 11, in a concentrated manner. In the case where depletion layer restricting regions are present, the thickness d of the depletion layer 8 with respect to the reverse bias voltage varies as shown by the broken line in FIG. 3(A), and thus once the depletion layer has reached the N conductivity type regions 11, its thickness increases rapidly with increasing reverse bias voltage $V_R$. This means that capacitance can be varied in a wider range for a given variation range of the reverse bias voltage. FIG. 3(B) shows characteristic curves representing variations of the capacitance C with respect to the reverse bias voltage $V_R$. The full and broken lines in FIG. 3(B) correspond to those shown in FIG. 3(A).

Consequently, capacitance between the capacitance reading-out electrodes 14 and the common electrode 15 is a junction capacitance at the interface between a portion of the P conductivity type layer, where the depletion layer 8 doesn't extend, and the N conductivity type regions 11. Since this junction capacitance varies correspondingly to variations of the depletion layer 8, which becomes thicker with increasing reverse bias voltage $V_R$, it decreases with increasing $V_R$.

In other words, at the capacitance reading-out terminals $R_1$ connected to the capacitance reading-out electrodes and to the common electrodes 15, respectively, it is possible to read out variations of the capacitance controlled by the reverse bias voltage $V_R$ applied between the depletion layer controlling electrode 13 and the common electrode 15.

Figure 4:
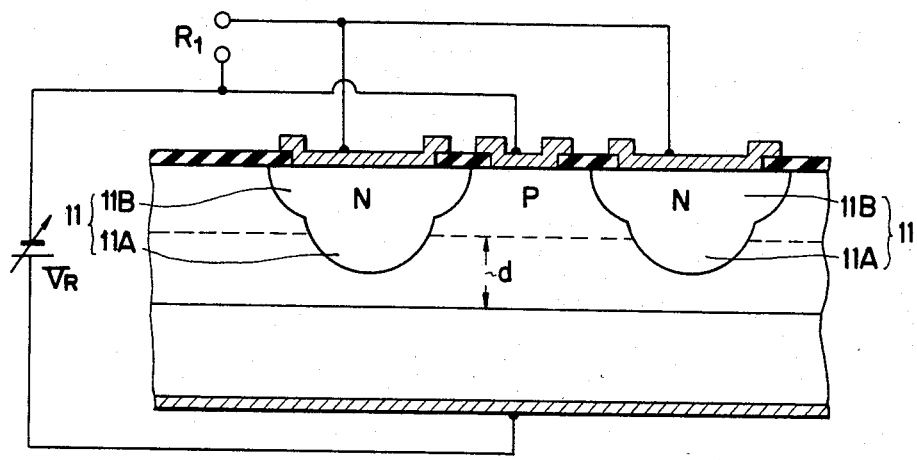
FIGS. 4, 5, and 6 are cross-sectional views representing various alternative embodiments of this invention.

FIG. 4 represents another embodiment of this invention, in which particularly the cross-sectional form of the N conductivity type regions is modified. That is, each of the N conductivity type regions 11 has a double structure consisting of a first N conductivity type portion 11A having a smaller radius of curvature and a second N conductivity type portion 11B having a greater radius of curvature. By disposing peripheries having various radii of curvature in the cross-sectional form of the N conductivity type regions 11 as described above, it is possible to change the rate of extension of the depletion layer with respect to variations of the reverse bias voltage, specifically to make variations of the capacitance less abrupt for relatively low reverse bias voltages. In this way it is possible to make the area contributing to increase of the read-out capacitance larger, and thus to reduce the area of semiconductor chips necessary for a given variation range of the read-out capacitance.

The double structure as mentioned above can be easily fabricated by a well-known selective diffusion method. The structure is not at all limited to a double one, but a multiple structure consisting of more than two portions is also possible.

Figure 5:
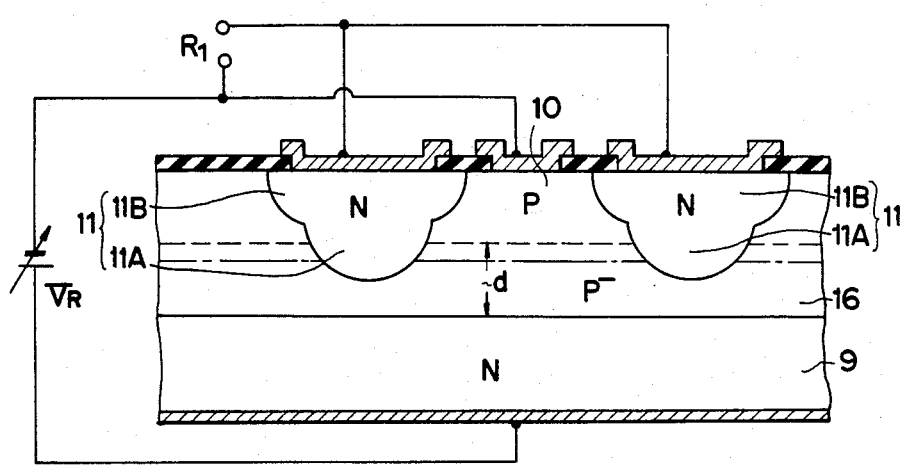

FIG. 5 represents still another embodiment of this invention, in which a second P conductivity type layer 16 having an impurity concentration which is lower than that of the P conductivity type layer 10 (so-called P-type high resistivity layer) is disposed between the N conductivity type layer 9 and the P conductivity type layer 10. By disposing a high resistivity layer 16 having the same conductivity type adjacent to the P conductivity layer 10, it is possible to make the extension of the depletion layer large for small reverse bias voltages having no contribution to capacitance variations, and thus to reduce reverse bias voltage loss. At the same time parasitic capacitance can be maintained at a low level.

Figure 6:
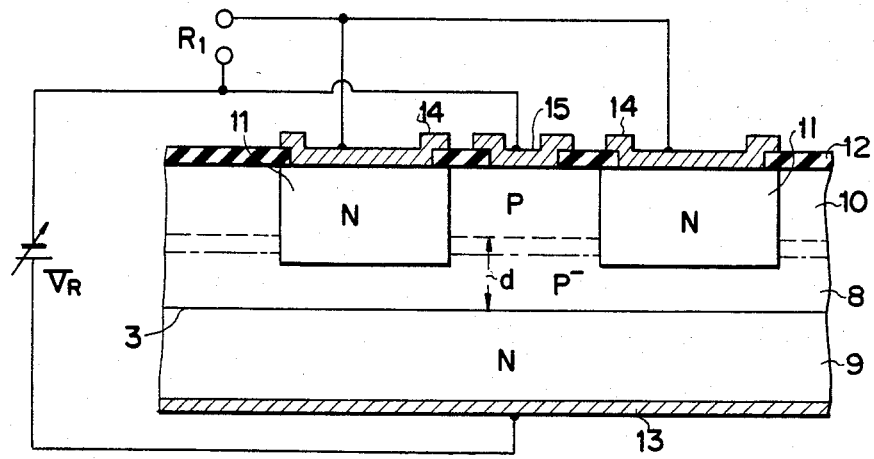

FIG. 6 represents still another embodiment of this invention, in which the N conductivity type regions have a modified cross-sectional form.

Figure 7:
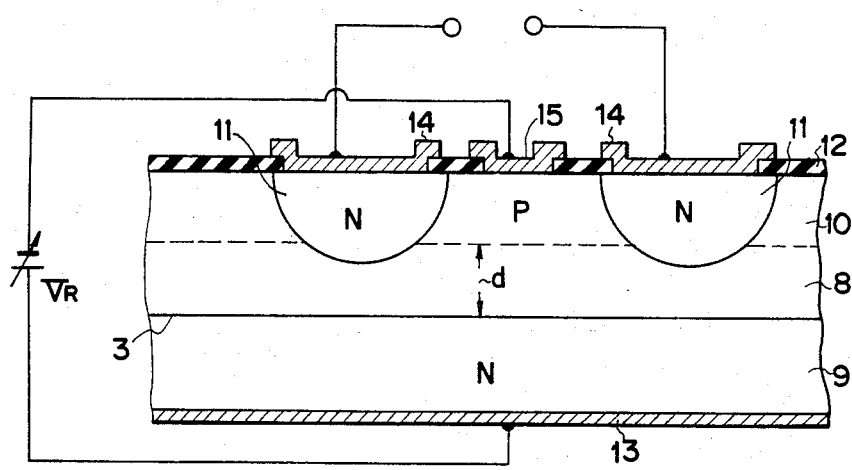
FIG. 7 is a cross-sectional view of another embodiment of this invention.

FIG. 7 represents still another embodiment of this invention, in which capacitance is read-out between the electrodes 14.

Figure 1:
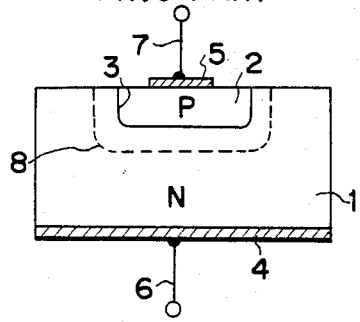
FIG. 1 is a cross-sectional view of a prior art variable capacitance device.
Figure 8:
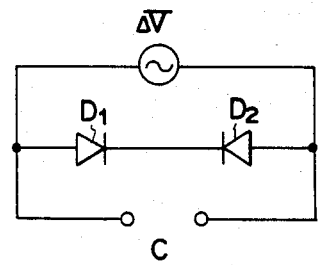
FIG. 8 is an equivalent electric circuit diagram for the device shown in FIG. 7.

As described above, capacitance between the capacitance reading-out electrodes 14 and the common electrode 15 is a junction capacitance $C_1$ or $C_2$ at the interface between a portion of the P conductivity type layer, where the depletion layer 8 doesn't extend, and the N conductivity type regions 11. On the other hand, a junction capacitance between a pair of N conductivity type regions 11 remains constant, because it is equivalent to the capacitance of diodes $D_1$ and $D_2$ connected in series and in the directions opposite to each other between the two capacitance reading-out electrodes 14, as shown by the equivalent circuit diagram in FIG. 8, and when an external input signal $\Delta V$ is applied to the diodes, the direction of the capacitance variation is opposite to each other for the diodes, as shown by the following equations.

That is, (1), in the case where no external input signal is applied;

$$1/C = 1/C_1 + 1/C_2 \qquad (A)$$

Next, (2), when an external input signal $\Delta V$ is applied, C being changed to C';

$$\begin{aligned}1/C' &= 1/C_1 + \Delta V + 1/C_2 + \Delta V \qquad (B)\\ &= 1/C_1\left(\frac{1}{1 + \Delta V/C_1}\right) + 1/C_2\left(\frac{1}{1 - \Delta V/C_2}\right)\\ &= 1/C_1(1 - \Delta V/C_1) + 1/C_2(1 + \Delta v/C_2)\\ &= 1/C_1 + 1/C_2 = 1/C\end{aligned}$$

Consequently, (B) is always identical to (A), that is, capacitance C read out at the terminals of the diodes $D_1$ and $D_2$ is always approximately constant, independently of the input signal $\Delta V$.

This junction capacitance C varies correspondingly to variations of the depletion layer 8 and becomes smaller with increasing reverse bias voltage $V_R$, because the depletion layer becomes thicker. Thus, between the two capacitance reading out electrodes 14, are read out capacitance variations controlled by the reverse bias voltage $V_R$ applied between the depletion layer controlling electrode 13 and the common electrode 15. The capacitance reading-out mode described above can be applied also for the embodiments shown in FIG. 4 to FIG. 6.

In the above embodiments, a P-N junction structure is used as a barrier for generating a depletion layer by disposing a depletion layer controlling electrode. The structure is not limited to a P-N junction, but other structures such as an MIS structure, a Schottky barrier structure, etc. can be also used.

As explained above, according to this invention, using a semiconductor substrate having second conductivity type semiconductor regions formed selectively in a surface portion of a first conductivity type semiconductor layer, and using a barrier for generating a depletion layer formed on the surface opposite to the surface portion of said first conductivity type semiconductor layer, said second conductivity type regions act as depletion layers restricting layer and at the same time as a capacitance reading-out section, capacitance variations of wider range than in the case where a depletion layer formed by a reverse bias voltage is simply used. Moreover, since the depletion layer control section and the capacitance reading-out section are formed independently, bad influences due to input signals can be avoided. Further, since the capacitance in the depletion layer is not determined only by the impurity concentration in the semiconductor layers, complicated means necessary for controlling exactly the impurity concentration become unnecessary, and thus integration of capacitance variable devices into IC circuits is possible.

It is evident that the P and N conductivity types mentioned above can be arbitrarily exchanged.

The embodiments of the invention in which an exclusive property or privilege is claimed are defined as follows:

1. A variable capacitor, comprising: a semiconductor substrate having a first layer made of a first conductivity type semiconductor material, two spaced-apart regions made of a second conductivity type semiconductor material provided on a surface of said first layer, and a second layer made of said second conductivity type semiconductor material and provided on a surface of said first layer opposite from said region of said substrate, said first and second layers defining a junction for generating a depletion layer in said first layer of said substrate; two capacitance read-out electrodes which are each provided on a respective said region of said substrate; a depletion layer control electrode provided on a surface of said second layer remote from said first layer; a common electrode provided on a surface of said first layer between said regions of said substrate so that said regions are provided on said first layer of said substrate on opposite sides of said common electrode; first and second capacitance read-out terminals respectively connected to said common electrode and to each of said capacitance read-out electrodes; and a reverse bias voltage source connected between said depletion control electrode and said common electrode for applying a reverse bias voltage therebetween; wherein as said reverse bias voltage is increased, said depletion layer increases in thickness and a capacitance between said capacitance read-out terminals decreases; and wherein the rates of change of said capacitance and the thickness of said depletion layer for a given change in said reverse bias voltage increase when said depletion layer is sufficiently thick to reach said region of said substrate, and wherein said regions of said substrate each have a cross-sectional shape which is substantially semicircular.

2. A variable capacitor, comprising: a semiconductor substrate having a first layer made of a first conductivity type semiconductor material, two spaced-apart regions made of a second conductivity type semiconductor material provided on a surface of said first layer, and a second layer made of said second conductivity type semiconductor material and provided on a surface of said first layer opposite from said region of said substrate, said first and second layers defining a junction for generating a depletion layer in said first layer of said substrate; two capacitance read-out electrodes which are each provided on a respective said region of said substrate; a depletion layer control electrode provided on a surface of said second layer remote from said first layer; a common electrode provided on a surface of said first layer between said regions of said substrate so that said regions are provided on said first layer of said substrate on opposite sides of said common electrode; first and second capacitance read-out terminals respectively connected to said common electrode and to each of said capacitance read-out electrodes; and a reverse bias voltage source connected between said depletion control electrode and said common electrode for applying a reverse bias voltage therebetween; wherein as said reverse bias voltage is increased, said depletion layer increases in thickness and a capacitance between said capacitance read-out terminals decreases; and wherein the rates of change of said capacitance and the thickness of said depletion layer for a given change in said reverse bias voltage increase when said depletion layer is sufficiently thick to reach said region of said substrate, and wherein said regions of said substrate each have a cross-sectional shape which includes a first substantially semicircular portion located adjacent the associated capacitance read-out electrode and a second substantially semicircular portion located on the side of said first portion remote from said capacitance read-out electrode and having a radius less than the radius of said first portion.

* * * * *